(12) United States Patent
Aksyuk et al.

(10) Patent No.: US 7,324,323 B2
(45) Date of Patent: Jan. 29, 2008

(54) PHOTO-SENSITIVE MEMS STRUCTURE

(75) Inventors: Vladimir Anatolyevich Aksyuk, Piscataway, NJ (US); Maria Elina Simon, New Providence, NJ (US); Richart Elliott Slusher, Lebanon, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 262 days.

(21) Appl. No.: 11/036,438

(22) Filed: Jan. 13, 2005

(65) Prior Publication Data

US 2006/0152105 A1   Jul. 13, 2006

(51) Int. Cl.
*H01G 5/00*   (2006.01)

(52) U.S. Cl. .................. 361/287; 361/272; 361/277; 361/283.3; 361/290; 361/292

(58) Field of Classification Search ........ 361/272–277, 361/278–282, 283.1, 283.3, 287, 290–292; 331/167, 177
See application file for complete search history.

(56) References Cited

U.S. PATENT DOCUMENTS

| | | | | |
|---|---|---|---|---|
| 5,501,893 A | 3/1996 | Laermer et al. | ............ | 428/161 |
| 5,629,790 A | 5/1997 | Neukermans et al. | ........ | 359/198 |
| 6,140,646 A | 10/2000 | Busta et al. | ................ | 250/332 |
| 6,201,631 B1 | 3/2001 | Greywall | .................... | 359/245 |
| 6,229,684 B1 * | 5/2001 | Cowen et al. | .............. | 361/278 |
| 6,392,221 B1 * | 5/2002 | Aksyuk et al. | ............. | 250/216 |
| 6,708,491 B1 * | 3/2004 | Weaver et al. | ................ | 60/527 |
| 6,781,744 B1 | 8/2004 | Aksyuk et al. | ............. | 359/290 |
| 6,858,911 B2 * | 2/2005 | Tamura et al. | .............. | 257/421 |
| 7,015,885 B2 * | 3/2006 | Novotny et al. | .............. | 345/84 |
| 7,146,014 B2 * | 12/2006 | Hannah | ....................... | 381/92 |
| 7,157,984 B2 * | 1/2007 | McCorquodale et al. | ... | 331/167 |

OTHER PUBLICATIONS

Hunter, Scott R., et al., "High Sensitivity Uncooled Microcantilever Infrared Imaging Arrays," Infrared Technology and Applications XXIX, pp. 469-480, B.F. Andresen, G.F. Fulop, Eds., Proceedings of SPIE vol. 5074 (2003).

* cited by examiner

*Primary Examiner*—Nguyen T. Ha
(74) *Attorney, Agent, or Firm*—John F. McCabe

(57) ABSTRACT

A heat-sensitive apparatus includes a substrate with a top surface, one or more bars being rotatably joined to the surface and having bimorph portions, and a plate rotatably joined to the surface and substantially rigidly joined to the one or more bars. Each bimorph portion bends in response to being heated. The one or more bars and the plate are configured to cause the plate to move farther away from the top surface in response to the one or more bimorph portions being heated.

12 Claims, 6 Drawing Sheets

150 200 250 300

PHOTO-SENSITIVE MEMS STRUCTURE

BACKGROUND

1. Field of the Invention

The invention relates to micro-electromechanical systems (MEMS's) and light or heat sensitive detectors.

2. Discussion of the Related Art

Some infrared light detectors use MEMS structures. One such light detector includes a MEMS structure with a capacitor and a cantilever arm. The capacitor has a fixed plate and a mobile plate. Each cantilever arm has a first end, which is physical fixed to a substrate, and a second end, which is fixed to the mobile capacitor plate. Each cantilever arm also includes a bimorph portion that bends in response to being heated by absorption of infrared light. Bending of the bimorph portion displaces the mobile plate in a manner that changes the distance between the mobile and fixed plates of the associated absorber. Thus, illumination of one of the MEMS structures by infrared light produces a measurable change in an electrical property of the structure, i.e., the capacitance of the capacitor. By measuring variations in such capacitances, the light detector is able to determine the intensity of infrared light illuminating such each MEMS structure, i.e., each pixel element of the detector.

BRIEF SUMMARY

Some conventional light detectors that incorporate a photo-sensitive MEMS structure are damaged by intense illumination. In particular, illumination with intense light causes two portions of one of these MEMS structures to come into physical contact. When brought into physical contact, the two portions may permanently stick thereby damaging the MEMS structure. To avoid such damage, various embodiments of MEMS structures are configured to avoid bringing different portions of the structures into physical contact when the structures are illuminated.

In one aspect, the invention features a heat-sensitive apparatus. The apparatus includes a substrate with a top surface, one or more bars rotatably joined to the surface and having bimorph portions, and a plate rotatably joined to the surface and substantially rigidly joined to the one or more bars. Each bimorph portion bends in response to being heated. The one or more bars and the plate are configured to cause the plate to move farther away from the top surface in response to the one or more bimorph portions being heated.

In another aspect, the invention features an apparatus that includes a substrate with a surface, one or more bimorph first bars, one or more second bars, and first and second capacitor plates. Each bimorph first bar is rotatably joined to the surface by an associated first hinge and is configured to bend in response to being heated. Each second bar is rotatably joined to the surface by an associated second hinge and has a portion substantially rigidly fixed to an associated one of the one or more first bars. The first capacitor plate is substantially rigidly fixed to the one of the one or more bimorph first bars. The second capacitor plate faces the first capacitor plate and is rigidly fixed to the surface.

In another aspect, the invention includes an apparatus. The apparatus includes a substrate with a surface and an array of light absorbers spread along the surface of the substrate. Each absorber includes one or more bimorph first bars. Each bimorph first bar is rotatably joined to the substrate by an associated first hinge and is configured to bend in response to being heated. Each absorber also includes first and second capacitor plates. The first capacitor plate is substantially fixed to one of the one or more bimorph first bars. The second capacitor plate faces the first capacitor plate and is fixed to the surface. Application of heat to one of the absorbers causes the first plate of the one of the absorbers to move farther from the second plate of the one of the absorbers.

BRIEF DESCRIPTION OF THE DRAWINGS

Herein, like reference numbers indicate functionally similar structures and/or features.

The illustrative embodiments are described more fully by the Figures and detailed description. The inventions may, however, be embodied in various forms and are not limited to embodiments described in the Figures and detailed description.

DETAILED DESCRIPTION OF ILLUSTRATIVE EMBODIMENTS

Figure 1:
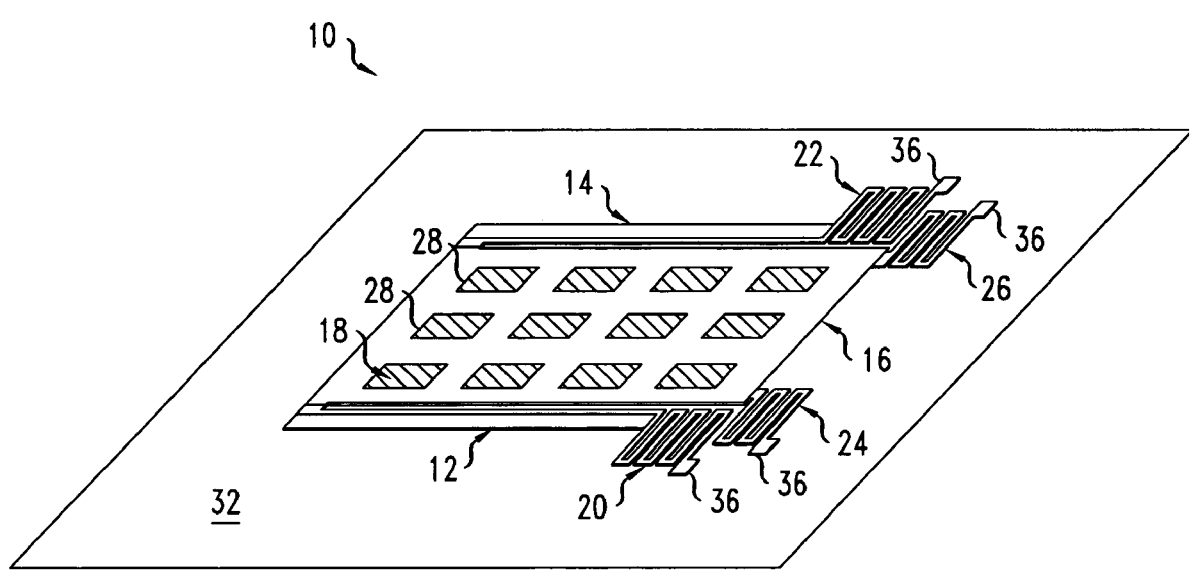
FIG. 1 is an oblique view of a light-sensitive and/or heat-sensitive MEMS structure.
Figure 2:
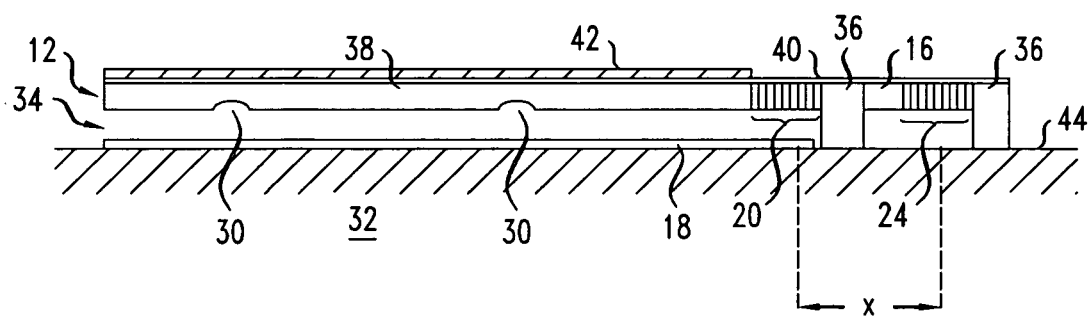
FIG. 2 is a side-view of the MEMS structure of FIG. 1 in a cold or relaxed state.
Figure 3:
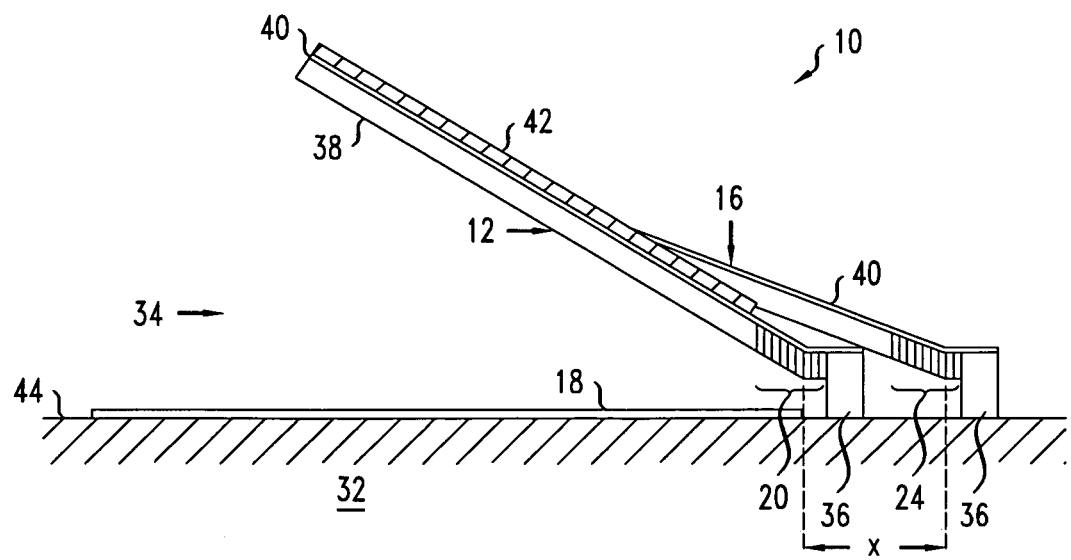
FIG. 3 is a side-view of the MEMS structure of FIG. 1 in a hot state.

FIGS. 1-3 show a light-sensitive and/or heat-sensitive planar MEMS structure 10 that includes flexible planar arms 12, 14; mobile top plate 16; fixed bottom plate 18 visible through holes 18 in the mobile top plate 16; first planar hinges 20, 22; and second planar hinges 24, 26. Each arm 12, 14 has a first end that rigidly connects to one side of an associated first planar hinge 20, 22 and a second side that substantially rigidly connects to one side of the mobile top plate 16. One side of the mobile top plate 16 also rigidly connects to one side of the second planar hinges 24, 26. The mobile top plate 16 typically includes an array of through holes 28 and may have dimples 30 on its lower surface to aid in manufacture. The fixed bottom plate 18 is rigidly fixed to a planar surface of the substrate 32 and faces the mobile top plate 16. The substrate 32 may be a dielectric coated silicon wafer that includes CMOS control and measurement circuitry, i.e., located below the dielectric coating. The two plates 16, 18 are separated by an empty gap 34. One side of each hinge 20, 22, 24, 26 also rigidly connects to the substrate 32 via an anchor structure 36.

The arms 12, 14; top plate 16; and hinges 20, 22, 24, 26 are fabricated of a dielectric matrix 38, e.g. a 0.35 micron thick amorphous hydrogenated silicon carbide (a-SiC:H) layer. Exemplary arms 16, 18 are about 2-3 microns wide. Exemplary top and bottom plates 16, 18 are about 10-40 microns wide and about 25-45 microns long so that the entire MEMS structure 10 is able to fit into a square pixel region with a side length of about 25-50 microns, e.g., a pixel of the image plane of a pixilated infrared camera. The increased width of the mobile top plate 16 makes its much less bendable than the arms 16, 18. The hinges 20, 22, 24, 26 provide good thermal isolation of the mobile top plate 16 and flat bars 12, 14 from surroundings. Exemplary hinges 20, 22, 24, 26 are flat serpentine springs made of an a-SiC:H ribbon whose width is in the range of about 0.3-0.6 microns and is preferably about 0.35 microns. In each spring, the a-SiC:H ribbon may have a total length of about 50 microns to provide good thermal isolation from the surroundings and may have a per turn length of about 5 microns. In various embodiments, such springs may have different shapes and sizes.

Herein, spring refers to an elastic serpentine manufactured structure that recovers its original shape after being mechanically distorted.

Since the hinges 20, 22, 24, 26 provide good thermal isolation of the mobile top plate 16 and the flat bars 12, 14 from the surroundings, the absorption of infrared light by the mobile top plate 16 will heat the flat bars 12, 14 thereby causing a mechanical reaction therein. Since a-SiC:H has a low thermal conductivity, using long thin springs for the hinges 20, 22, 24, 26 provides adequate thermal isolation. In embodiments of infrared light detectors, the absorption of infrared light by the mobile top plate 16 and resulting heating of the flat bars 12, 14 is typically enhanced, because the mobile top and fixed bottom plates 16, 18 form an optical cavity for infrared light. Then, a substantial part of the infrared light, which is trapped by the optical cavity is absorbed in the TiW and a-SiC:H material of the mobile top plate 16 to produce heat that diffuses to heat the flat bars 12, 14.

The arms 12, 14; top plate 16; and hinges 20, 22, 24, 26 have a thin metallic top coating 40, e.g., about 0.01-0.03 microns of titanium-tungsten (TiW). The thin metallic coating 40 enables the mobile top plate 16 to function as a capacitor plate. The thin metallic coating 40 also provides an electrical path between the mobile top plate 16 and other circuitry (not shown) in the substrate 32. This other circuitry may include one or more other capacitors and CMOS circuits, e.g., for controlling and/or measuring properties of the capacitor.

The fixed bottom plate 18 is a good conductor, e.g., a layer of metal or heavily doped polysilicon. The fixed bottom plate 18 functions as a second plate of the capacitor whose first plate is formed by the TiW layer on the mobile top plate 16.

The mobile top plate 16 and fixed bottom plate 18 form a variable capacitor. The capacitor is variable, because the width of the gap 34 changes as the mobile top plate 16 is moved with respect to the fixed bottom plate 18. Bending of the arms 16, 18, causes movement of the mobile top plate 16. The resulting changes to the width of the gap 34 vary the capacitance of the capacitor formed by the mobile and fixed plates 16, 18. In the substrate 32, the other circuitry may include other capacitors (not shown) connected to the capacitor made of the plates 16, 18 to make a bridge circuit, i.e., one capacitor makes up each arm of the bridge circuit. Such a bridge circuit facilitates electrical measurements small variations in the capacitance of the variable capacitor made by the plates 16, 18.

Each arm 12, 14 has a portion with bimorph structure that includes dielectric matrix 38 and a thick layer 42 of metal, e.g., gold or aluminum, covering the dielectric matrix. During heating and cooling, both the layer 42 of metal and the dielectric matrix 38 are thick enough to produce stresses capable of bending the arms 12, 14. Preferably, the dielectric matrix 38 and metal of the thick layer 42 have very different thermal expansion coefficients ($\alpha$) to enhance such bending responses to heat. Thus, the bimorph structures cause the arms 12, 14 to be mechanically responsive to heating, e.g., heating caused by the absorption of infrared light in mobile top plate 16.

Herein, a bimorph structure includes, at least, two adjacent layers of different materials, which are bonded together, e.g., by a thin intermediate material layer or by van der Waals forces. In a bimorph structure, both layers are thick enough to produce substantial stresses on the other layer during thermal expansion or contraction, i.e., stresses sufficient to bend the structure.

The structure formed by the dielectric matrix 38 and the thin metal coating 40 does not of itself form a bimorph structure. In particular, the metallic coating 32 is kept very thin so that it does not produce stresses that significantly bend the layer of dielectric matrix 38. For this reason, the mobile top plate 16 does not have a bimorph structure and does not significantly bend in response to the absorptions of infrared light that cause bending of the flat arms 12, 14.

The MEMS structure 10 has a cold or relaxed state as shown in FIG. 2 and hot states as qualitatively shown in FIG. 3. In the hot states, the arms 12, 14 are bent in a manner that moves the mobile top plate 16 farther from the fixed bottom plate 18 than in the cold state. Thus, heating the MEMS structure 10 brings the top and bottom plates 16, 18 farther apart rather than closer together. For that reason, heating the MEMS structure 10 will not bring the plates 16, 18 into physical contact, which might otherwise cause sticking or damage thereto.

To produce a hot state, the MEMS structure 10 may be illuminated by infrared light. The absorption of such infrared light produces heat that moves the MEMS structure 10 to a hot state. In particular, the metallic layer 32 and bottom plate 18 may form an optical cavity that enables the absorption of such light to produce adequate heating to bend the arms 12, 14. Thus, the MEMS structure 10 may form the photosensitive elements of the pixels of an infrared camera.

In the MEMS structure 10, the mobile top plate 16 rigidly connects to one end of the arms 12, 14 and rotates about a different axis than the arms 12, 14. The arms 12, 14 rotate about an axis that is parallel to and shifted by "x" with respect to the rotation axis of the mobile top plate 16. For that reason, bending of the arms 12, 14 causes a rotation of the mobile top plate 16 that changes the size of the gap 34 between the top plate 16 and the bottom plate 18 of the associated capacitance.

The top plate 16 and arms 12, 14 are configuration so that heating of the arms 12, 14 produces a particular type of rotational response by the mobile top plate 16. The rotational response displaces the mobile top plate 16 farther away from the fixed bottom plate 18 rather than displacing the mobile top plate 16 towards the fixed bottom plate 18. The directional selectivity of the rotational response results from the asymmetry of the bent state of the flat arms 12, 14. In particular, heating causes a bending wherein the top surfaces of the flat arms 12, 14 take a convex up form. In addition, since the mobile top plate 16 is substantially rigidly fixed to the arms 12, 14, the bent arms 12, 14 are constrained to remain substantially parallel to the plane of the mobile top plate 16 at the joint between the arms 12, 14 and the mobile top plate 16. For these reasons, heating the arms 12, 14 causes the mobile top plate 16 to rotate away from rather than towards the fixed bottom plate 18.

Figure 4:
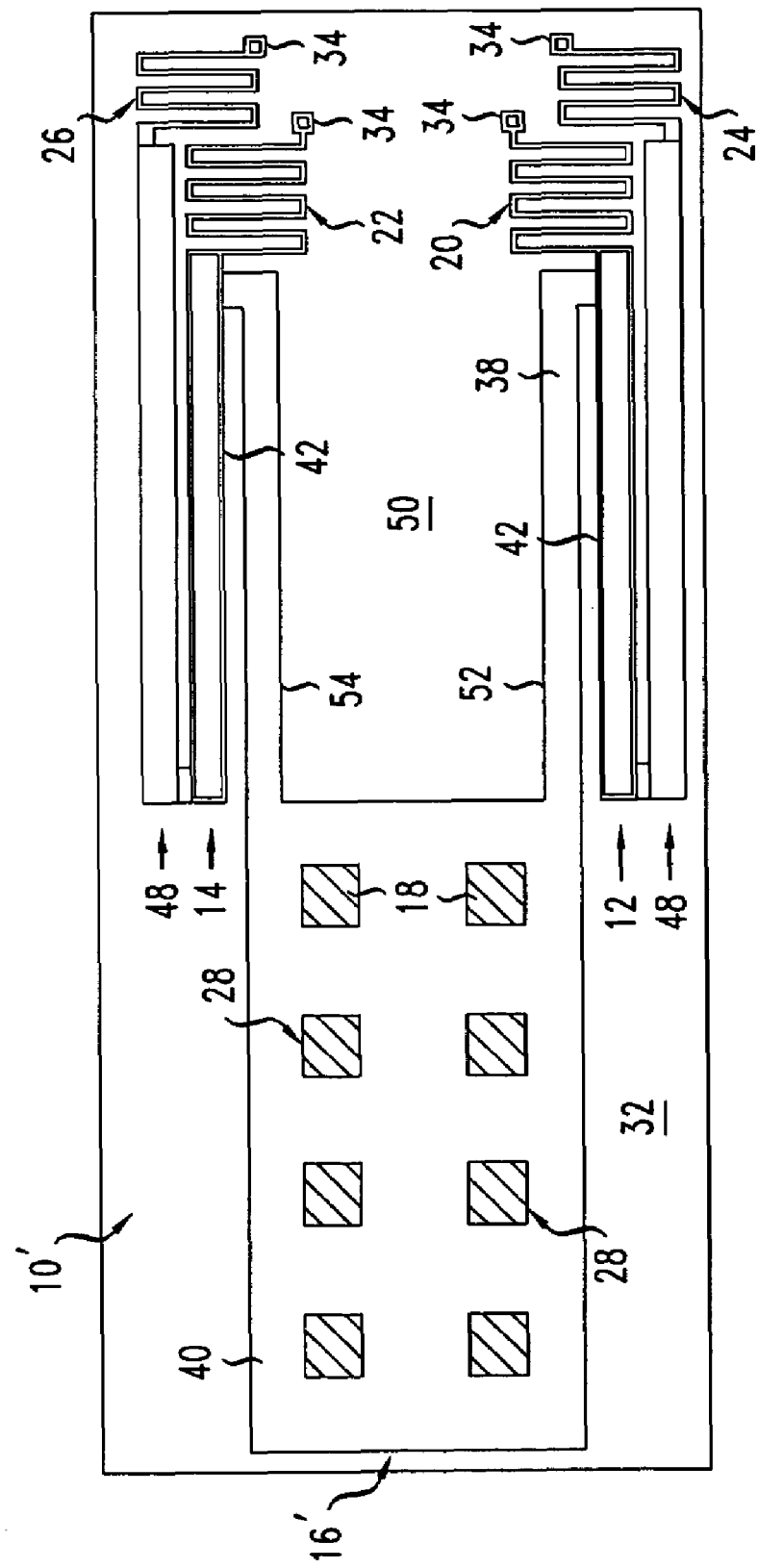
FIG. 4 is an oblique view of an alternate embodiment of a MEMS structure in which the mobile capacitor plate has an increased mechanical sensitivity to heat and/or infrared light.

FIG. 4 shows an alternate MEMS structure 10' with a higher sensitivity to heating and/or illumination by infrared light. The MEMS structure 10' includes the elements already described with respect to MEMS structure 10 of FIGS. 1-3.

In addition, the MEMS structure 10' includes a pair of flat non-bimorph bars 46, 48, e.g., a-SiC:H bars. First ends of the bars 46, 48 rigidly connect to first ends of the flat bars 12, 14 with bimorph structures. Second ends of the flat non-bimorph bars 46, 48 rigidly connect to one side of the hinges 24, 26. The flat bars 46, 48 are stiffer than the flat bars 12, 14 so that bending of the bars 12, 14 does not substantially bend the flat non-bimorph bars 46, 48. The added stiffness may be produced by making the thickness or width of the flat non-bimorph bars 46, 48 about 2-3 times thicker or wider than the flat bars 12, 14. Mechanically, the flat non-bimorph bars 46, 48 replace the mobile top plate 16 of FIG. 1 by applying forces to first ends of the flat bars 12, 14 when said bars 12, 14 are subjected to heating.

In addition, the MEMS structure 10' includes a mobile top plate 16' with a different form than the mobile top plate 16 of FIG. 1. First, the mobile top plate 16' has rectangular extensions 52, 54, e.g., TiW coated a-SiC:H bars, which substantially rigidly connect to the opposite end of the flat bars 12, 14 as compared to the mobile top plate 16 of FIG. 1. In particular, the extensions 52, 54 connect nearer to the ends of the flat bars 12, 14 that connect to the hinges 20, 22 than to the ends of the flat bars 12, 14 that connect to the non-bimorph bars 46, 48. Second, unlike the mobile top plate 16 of FIG. 1, the mobile top plate 16' is not separately connected to the substrate 32 by hinges 24, 26.

The mobile top plate 16' would typically also have an array of through holes 28 and dimples (not shown) on its bottom side. Such holes are useful during the wet etch used to release the mobile top plate 16' from underlying sacrificial material during fabrication of the MEMS structure 10'.

The MEMS structure 10' is configured to produce larger rotations by the mobile top plate than in the MEMS structure 10, when both structures 10, 10' have elements of comparable or equal dimensions. In particular, different longitudinal portions of the bars 12, 14 have different slopes when the bars 12, 14 bend in response to heating. With respect to the planar top surface of the substrate 32, the slope is typically greater in heated portions of the bars 12, 14 that are located nearer to hinges 20, 22. In the MEMS structure 10', the slope of the mobile top plate 16' of FIG. 4 is equal to the slope of those same portions of the bars 12, 14. In contrast, the slope of the mobile top plate 16 of FIGS. 1-3 is equal to the slope of the ends of the bars 12, 14 that are located farthest from the hinges 20, 22. For these reasons, the same amount of bending of the bars 12, 14 produces larger a rotation of the mobile top plate 16' in the MEMS structure 10' of FIG. 4 than of the mobile top plate 16 in the MEMS structure 10 of FIG. 1. The larger rotation typically implies a larger change in the capacitance of the capacitor formed by the mobile top plate 16, 16' and the fixed bottom plate 18 and thus, a larger response to heating.

Figure 5:
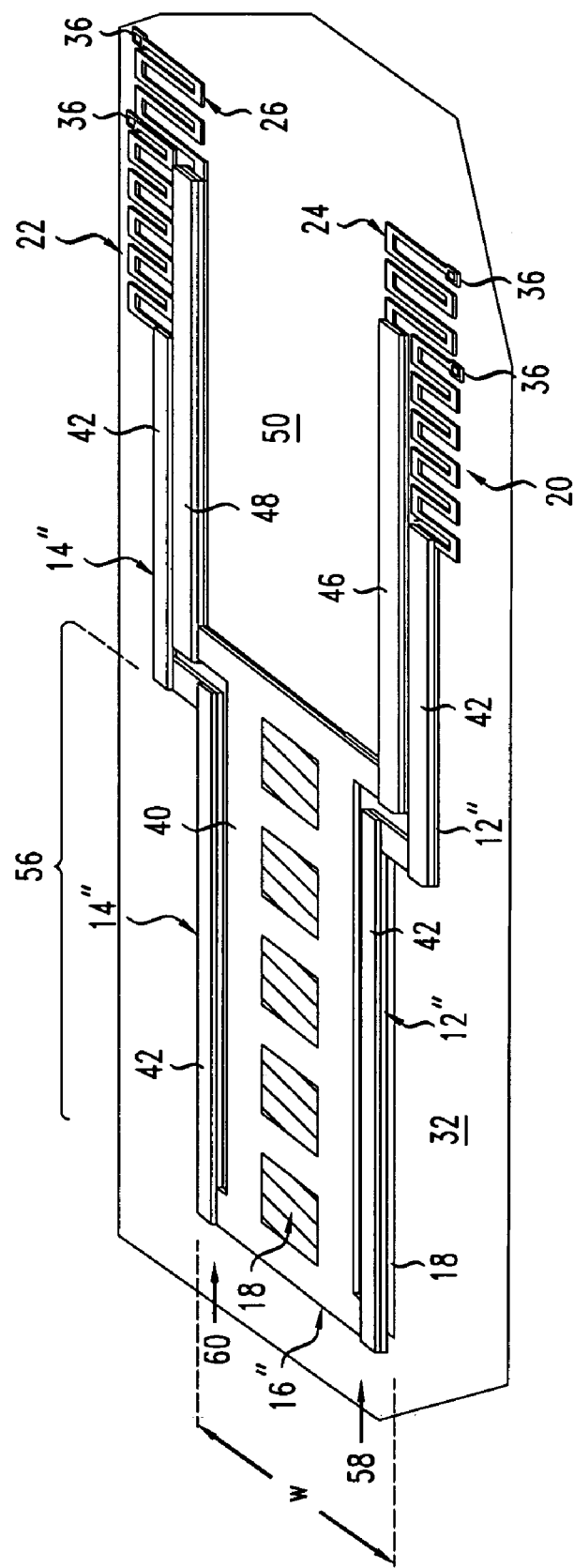
FIG. 5 is an oblique view of an alternate embodiment of a light-sensitive and/or heat-sensitive MEMS structure that is adapted for close positioning of neighboring identical MEMS structures.

FIG. 5 shows another alternate MEMS structure 10" that is also adapted to larger mechanical rotations by MEMS structures 10", which may be advantageous in a pixilated optical detector such as an infrared camera. In particular, the MEMS structure 10" has longer bimorph bars 12", 14" than in MEMS structure 10 of FIGS. 1-3 for comparable lateral area occupations thereby providing higher sensitivity to heating. The MEMS structure 10" is configured to have an area 50 free of functional elements. The area 50 can be occupied by a portion of the MEMS structure 10" of an adjacent pixel element of the optical detector (not shown). For example, portion 56 of the top and bottom plates 16", 18 and the bimorph bars 12", 14" of the adjacent MEMS structure 10" may occupy the area 56.

The MEMS structure 10" includes the elements of the MEMS structure 10 of FIGS. 1-3. In addition, the mobile top plate 16" of MEMS structure 10" includes a pair of flat extensions 46, 48, e.g., a-SiC:H bars that produce the unoccupied area 50 on the top surface of the substrate 32. The thickness of the extensions 46, 48 may be 2-3 times the thickness of the remainder of the mobile top plate 16" so that the extensions 46, 48 are substantially less flexible than the bars 12", 14". In addition, the bars 12", 14" include extensions 58, 60 with bimorph structures. The extensions 58, 60 laterally connect to one end of the remainder of the bars 12", 14" so that the lateral width, W, of portion 56 is smaller than the width of area 50, e.g., thereby enabling close packing of the MEMS structures 10" of adjacent pixels in a camera.

Figure 6:
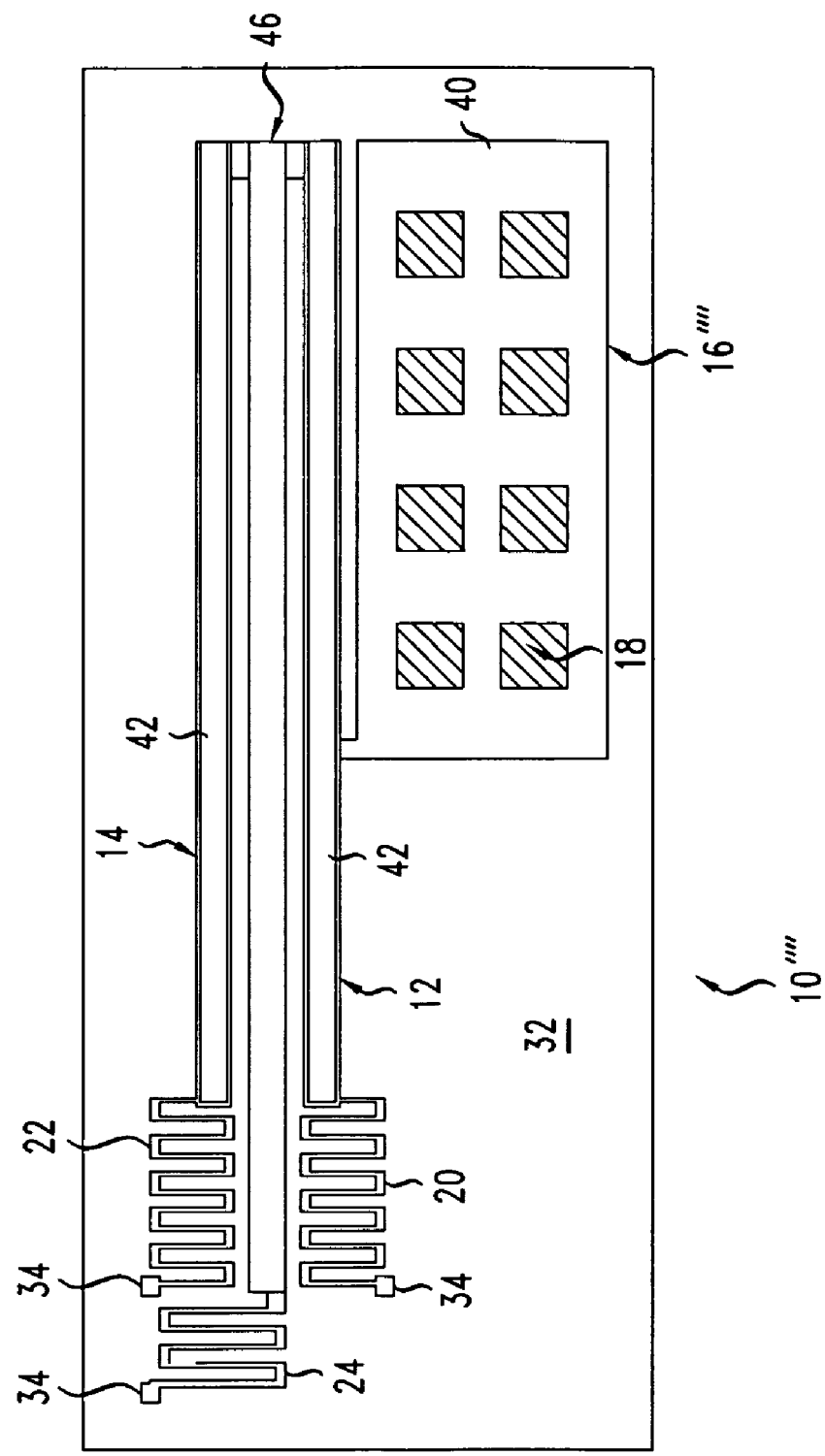
FIG. 6 is a top view of an alternate embodiment of a light-sensitive and/or heat-sensitive MEMS structure that uses a single auxiliary bar and two bimorph bars.

FIG. 6 shows an infrared light sensitive MEMS structure 10''' that functions similarly to the MEMS structure 10' of FIG. 4. With respect to features already described with respect to the MEMS structure 10', the MEMS structure 10'''' has several differences. First, the MEMS structure 10'''' only includes one flat non-bimorph bar 46, and both flat bimorph bars 12, 14 have an end that is substantially rigidly attached to one end of the single non-bimorph bar 46. The non-bimorph bar 46 is again substantially thicker or wider than the flat bimorph bars 12, 14 and thus is also substantially stiffer than the flat bimorph bars 12, 14. Second, the mobile top plate 16'''' of the capacitor substantially rigidly attaches to only one flat bimorph bar 12. The presence of less bars 12, 14, 46 enables the MEMS structure 10'''' to provide more efficient pixel packing in an infrared camera than would MEMS structures 10' of equal area while still providing for improved rotation reaction by the mobile top plate 16''''.

Figure 7:
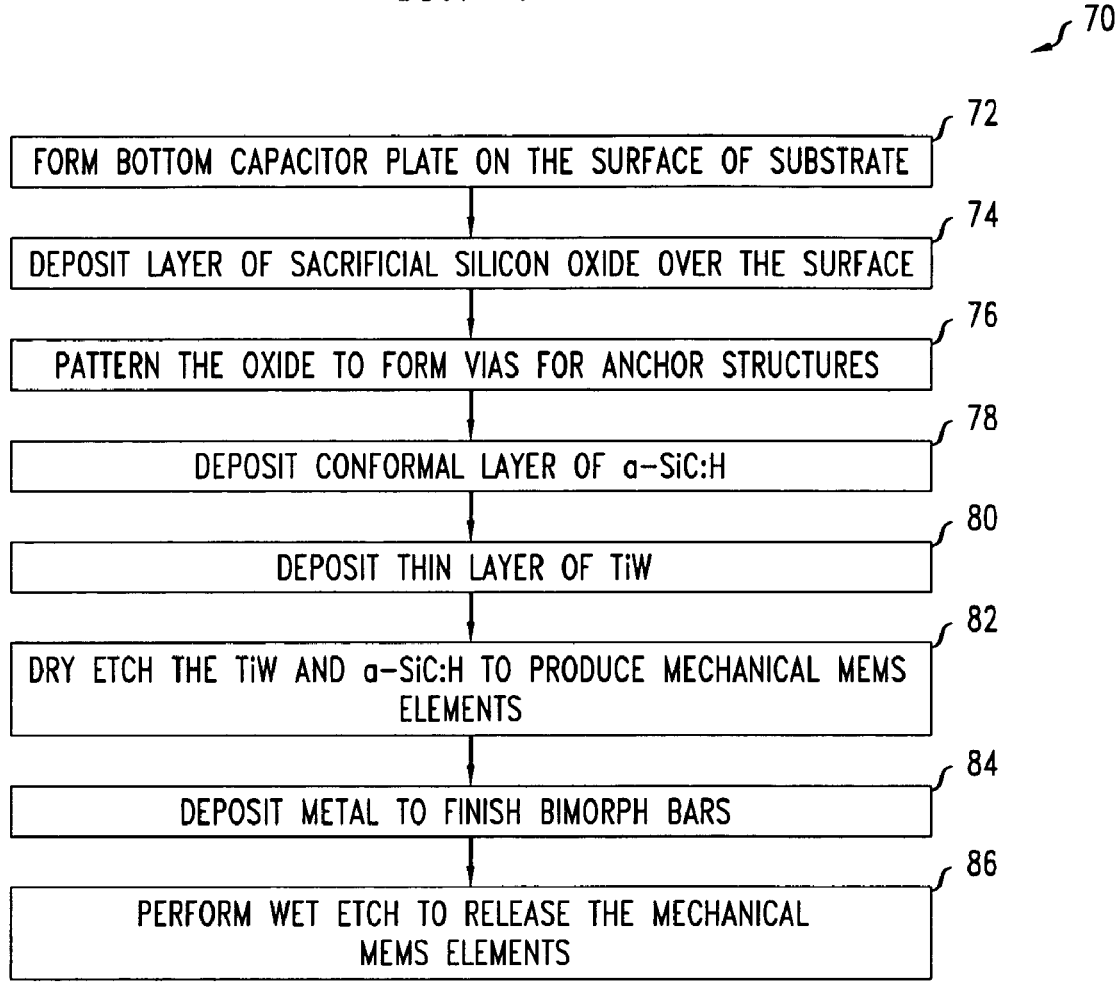
FIG. 7 illustrates a method for fabricating the MEMS structure of FIG. 1.

FIG. 7 illustrates an exemplary method 70 for fabricating MEMS structure 10 of FIG. 1 over a substrate 32. The substrate 32 may include a silicon wafer and an electrically insulating silicon nitride or silicon oxide layer over the silicon wafer. The silicon nitride of oxide layer electrically isolates overlying structures from the underlying silicon wafer and devices therein. An exemplary silicon nitride layer has a thickness of about 0.2-0.5 microns.

The substrate 32 may also include underlying CMOS drive and measurement circuitry and metal filled vias to provide electrical connections between such underlying CMOS circuitry and to be formed elements of the MEMS structure 10. For example, these elements typically would include bottom capacitor plate 18 and anchor structures 36.

Other compositions and layer structures are possible for the substrate 32.

The method 70 includes forming the bottom capacitor plate 18 on the planar top surface of the substrate 32 (step 72). The forming step includes depositing either a metal layer or a heavily doped polysilicon layer, e.g., on the top surface of the silicon nitride or oxide layer of the exemplary substrate 32. After the deposition, a mask-controlled dry etch produces an isolation trench around the selected area for the bottom capacitor plate 18. The dry etch is, e.g., a reactive ion etch that stops on silicon nitride if the substrate 32 has an insulating silicon nitride layer. Forming bottom capacitor plate 18 may also include producing an electrical contact for the capacitor plate 18 to underlying CMOS circuitry, e.g., by forming a via through the silicon nitride or oxide layer and filling the via with a conducting post.

Next, the method 70 includes depositing a layer of sacrificial silicon oxide over the previously formed structure (step 74). The thickness of the layer of sacrificial silicon oxide is equal to the desired width of the gap 34 between the final top and bottom capacitor plates 16, 18 in the cold state. The gap 34 has a width in the range of 0.1-2 microns, e.g., a width of about 0.5 microns.

Next, the method 70 includes patterning the layer of silicon oxide to produce vias for anchor structures 36 that will physically support overlying portions of the MEMS structure 10 (step 76). The patterning may involve performing a reactive etch that selectively stops on the underlying silicon layer, e.g., a fluorine-based reactive ion etch.

Next, the method 70 includes depositing a substantially conformal layer of about 0.3 microns of amorphous hydrogenated silicon carbide on the previously formed structure (step 78). The a-SiC:H layer should cover exposed surfaces with a substantially uniform thickness, i.e., independent of the orientation of the underlying surface. The a-SiC:H, which is deposited in the vias, will form the anchor structures 36 of FIGS. 1-3.

Next, the method 70 includes depositing a thin layer of titanium-tungsten (TiW), e.g., a 0.01-0.05 micron thick layer, over the previously formed structure (step 80). The TiW will form the electrical portion of the top capacitor plate 16 and the electrical paths to and through the anchor structures 36 to electrical circuits in the substrate 32. To form such pathways, a further dry etch may be needed prior to the TiW deposition to clear a-SiC:H from bottoms of the vias for the anchor structures 36.

Next, the method 70 includes performing a mask-controlled etch of the TiW and a-SiC:H layers to produce the mechanical elements of the MEMS structure 10 (step 82). These elements include the flat bars 12, 14; mobile top plate 16, hinges 20, 22, 24, 26; and anchor structures 36.

Next, the method 70 includes forming thick layers 42 of metal on the flat bars 10, 12 to produce bimorph structures (step 84). Exemplary processes for producing the layers 42 of metal include a mask-controlled deposition of about 0.2-0.3 microns of gold or aluminum. Forming the thick layers 42 may also include depositing a seed layer of titanium or chromium prior to the deposition of gold.

Finally, the method 70 includes performing a wet etch of the previous structure to release the MEMS structure 10 by removing the sacrificial silica glass layer (step 86). Exemplary wet etches use an HF based etchant.

The method 70 may use various lithographic techniques to define features, e.g., of masks. Suitable lithographic techniques for defining features as small as about 0.25 microns are, e.g., described in one or more of U.S. Pat. Nos. 6,201,631; 5,629,790; and 5,501,893; which are incorporated herein by reference.

The method 70 may use well-known ion implantation methods to enhance mechanical strengths of mechanical structures of the MEMS structure 10.

From the disclosure, drawings, and claims, other embodiments of the invention will be apparent to those skilled in the art.

What we claim is:

1. An apparatus, comprising:
   a substrate with a top surface;
   one or more bars being rotatably joined to the surface and having bimorph portions, each bimorph portion being configured to bend in response to being heated;
   a plate rotatably joined to the surface and substantially rigidly joined to the one or more bars, the one or more bars and the plate being configured to cause the plate to move farther away from the top surface in response to the one or more bimorph portions being heated.

2. The apparatus of claim 1, wherein one end of each bar is connected to a first type hinge that is in contact with the substrate and wherein the plate is connected to a second type hinge that is in contact with the substrate.

3. The apparatus of claim 2, wherein the first type hinge rotates about a different axis than the second type hinge.

4. The apparatus of claim 2, wherein the hinges are flat springs.

5. The apparatus of claim 2, wherein the plate further comprises:
   a pair of bars that connect the plate to the second type hinges.

6. The apparatus of claim 1, further comprising a conducting plate located on the substrate and facing the plate, the two plates forming plates of a capacitor.

7. The apparatus of claim 1, wherein the plate is at least three times as wide as the bars.

8. An apparatus, comprising:
   a substrate with a surface
   one or more bimorph first bars, each bimorph first bar being rotatably joined to the surface by an associated first hinge and being configured to bend in response to being heated;
   one or more second bars, each second bar being rotatably joined to the surface by an associated second hinge and being substantially rigidly fixed to one of the one or more first bars;
   a first capacitor plate being substantially rigidly fixed to the one of the one or more first bars, and
   a second capacitor plate facing the first capacitor plate and being rigidly fixed to the surface.

9. The apparatus of claim 8, wherein the bars are configured to displace the first capacitor plate farther away from the surface in response to the one or more bimorph first bars being heated.

10. The apparatus of claim 8, wherein the one or more first hinges rotate about one or more axes that are different from the one or more axes about which the one or more second hinges rotate.

11. The apparatus of claim 8, wherein the one or more second bars are substantially stiffer than the one or more bimorph first bars.

12. The apparatus of claim 8, wherein the first capacitor plate substantially rigidly fixes to a portion on one of the one or more bimorph first bars that is located closer to the associated first hinge than to a point where one of the one or more second bars is substantially rigidly fixed to the one of the one or more bimorph first bars.

* * * * *